United States Patent
Zeng et al.

(10) Patent No.: US 9,748,518 B2
(45) Date of Patent: Aug. 29, 2017

(54) THIN-FILM PACKAGING METHOD AND ORGANIC LIGHT-EMITTING DEVICE

(71) Applicant: Shenzhen China Star Optoelectronics Technology Co., Ltd., Shenzhen, Guangdong (CN)

(72) Inventors: Weijing Zeng, Guangdong (CN); Xingyu Zhou, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 142 days.

(21) Appl. No.: 14/784,158

(22) PCT Filed: Sep. 11, 2015

(86) PCT No.: PCT/CN2015/089428
§ 371 (c)(1),
(2) Date: Oct. 13, 2015

(87) PCT Pub. No.: WO2017/035866
PCT Pub. Date: Mar. 9, 2017

(65) Prior Publication Data
US 2017/0155081 A1    Jun. 1, 2017

(30) Foreign Application Priority Data
Sep. 2, 2015  (CN) .......................... 2015 1 0559241

(51) Int. Cl.
*H01L 51/56* (2006.01)
*H01L 51/52* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC .. H01L 51/5253; H01L 51/56; H01L 51/0097
See application file for complete search history.

(56) References Cited

U.S. PATENT DOCUMENTS 5,484,749 A * 1/1996 Maeda ................. C23C 16/401
257/E21.275
7,301,280 B2 * 11/2007 Su ....................... H01L 51/5253
313/504
(Continued)

*Primary Examiner* — Kyoung Lee
*Assistant Examiner* — Christina Sylvia
(74) *Attorney, Agent, or Firm* — Andrew C. Cheng

(57) ABSTRACT

A thin-film packaging method and an organic light-emitting device are provided. The method includes following steps: forming an OLED layer on a TFT substrate, forming a first inorganic packaging layer on the OLED layer, forming a coupling agent unit on the first inorganic packaging layer, and forming an organic packaging layer on the coupling agent unit. Wherein, the organic packaging layer includes a buffer sublayer and a resist sublayer sequentially formed. The coupling agent unit generates chemical reactions with the first inorganic packaging layer and the buffer sublayer in order to increase an adhesive strength between the first inorganic packaging layer and the organic packaging layer so that they are not easily to be separated, and have a good water and oxygen insulation property.

20 Claims, 6 Drawing Sheets

(51) Int. Cl.
  *H01L 51/00* (2006.01)
  *H01L 27/32* (2006.01)
(52) U.S. Cl.
  CPC ........ *H01L 51/56* (2013.01); *H01L 2227/323* (2013.01); *H01L 2251/301* (2013.01); *H01L 2251/5338* (2013.01); *H01L 2251/558* (2013.01)

(56) References Cited

U.S. PATENT DOCUMENTS

| | | | |
|---|---|---|---|
| 8,446,730 B2 * | 5/2013 | Chen | H01L 51/0097 206/204 |
| 2002/0123218 A1 * | 9/2002 | Shioya | H01L 21/3105 438/635 |

* cited by examiner

THIN-FILM PACKAGING METHOD AND ORGANIC LIGHT-EMITTING DEVICE

BACKGROUND OF THE INVENTION

1. Field of the Invention

The present invention relates to a technology field of organic light-emitting device, and more particularly to a thin-film packaging method and an organic light-emitting device manufactured by the thin-film packaging method.

2. Description of Related Art

An Organic Light-Emitting Diode (OLED) display has characters of self-emitting, high brightness, wide viewing angle, high contrast ratio, flexible, low power consumption, and so on. Therefore, the OLED display is under wide attention, and becomes a next generation display method. Besides, the OLED display has gradually replaces the conventional Liquid Crystal Display (LCD), and be widely applied in a cell phone monitor, a computer display, or a full-color TV, and so on. Wherein, a flexible display technology of the OLED display utilizes a very thin organic light-emitting layer and a flexible substrate. When a current passes through, the organic light-emitting layer will emit lights. Because an organic material is easily to react with water and oxygen, a few amount of steam or oxygen can damage the organic material so as to deteriorate a light-emitting performance of a display device. Therefore, a flexible OLED display not only requires that the substrate is flexible, but also requires a good water and oxygen insulation property.

Currently, a packaging method for an OLED display is generally utilizes an organic material and an inorganic material stacked together to form a thin-film packaging. However, if adhesion between a surface of the organic material and a surface of the inorganic material is not good, after a certain of bending actions, the two materials are separated with each other so that the packaging is failed.

SUMMARY OF THE INVENTION

The present invention provides a thin-film packaging method and an organic light-emitting device in order to solve an adhesion problem between surfaces of the organic material and the inorganic material when the organic material and the inorganic material are stacked in the conventional art so that after a certain of bending actions, the two materials are separated with each other, and the packaging is failed.

In order to solve above technology problem, a technology adopted by the present invention is: a thin-film packaging method, comprising following steps: forming an Organic Light-Emitting-Diode (OLED) layer on a Thin-Film-Transistor (TFT) substrate; forming a first inorganic packaging layer on the OLED layer; forming a coupling agent unit on the first inorganic packaging layer; forming an organic packaging layer on the coupling agent unit; wherein, the organic packaging layer includes a buffer sublayer and a resist sublayer sequentially formed on the coupling agent unit, the coupling agent unit generates chemical reacts with the first inorganic packaging layer and the buffer sublayer in order to increase an adhesive strength between the first inorganic packaging layer and the organic packaging layer; wherein, a chemical formula of a composition of the coupling agent unit is $Y(CH)nX_3$, wherein, X represents a hydrolysable group, when hydrolyzing, $Si(OH)_3$ is produced, and X is combined with inorganic substance to produce siloxane; n is a positive integral and ranged from 0 to 3; Y is an organic functional group, and chemically reacts with polymer to produce a hydrogen bond; wherein, a chemical formula of the organic packaging layer is $SiO_x$-$C_yH_z$, a thickness of the organic packaging layer ranges from 1000 nm to 5000 nm; and wherein, the buffer sublayer is formed by depositing on the coupling agent unit through a plasma enhanced chemical vapor deposition (PECVD) method, a gas flow ratio of O2 to Hexamethyldisiloxane (HMDSO) for depositing the buffer sublayer is that O2:HMDSO <3:1, wherein, a radio frequency power of HMDSO ranges from 200 W to 800 W, a flow rate of HMDSO ranges from 10 sccm to 50 sccm, a radio frequency power of $O_2$ ranges from 200 W to 800 W, and a deposition time of the buffer sublayer ranges from 10 minutes to 50 minutes.

In order to solve above technology problem, another technology adopted by the present invention is: a thin-film packaging method, comprising following steps: forming an Organic Light-Emitting Diode (OLED) layer on a Thin-Film Transistor (TFT) substrate; forming a first inorganic packaging layer on the OLED layer; forming a coupling agent unit on the first inorganic packaging layer; forming an organic packaging layer on the coupling agent unit; wherein, the organic packaging layer includes a buffer sublayer and a resist sublayer sequentially formed on the coupling agent unit, the coupling agent unit generates chemical reacts with the first inorganic packaging layer and the buffer sublayer in order to increase an adhesive strength between the first inorganic packaging layer and the organic packaging layer.

Wherein, a chemical formula of a composition of the coupling agent unit is $Y(CH)nX_3$, wherein, X represents a hydrolysable group, when hydrolyzing, $Si(OH)_3$ is produced, and X is combined with inorganic substance to produce siloxane; n is a positive integral and ranged from 0 to 3; Y is an organic functional group, and chemically reacts with polymer to produce a hydrogen bond.

Wherein, the X is a methoxy group, a chloro group, an ethoxy group, an acetoxy group, or a methoxy ethoxy; the Y is a vinyl group, an amino group, a methacryloyloxy group, a mercapto group or a urea group.

Wherein, a chemical formula of the organic packaging layer is $S_tO_xC_yH_z$, a thickness of the organic packaging layer ranges from 1000 nm to 5000 nm.

Wherein, the buffer sublayer is formed by depositing on the coupling agent unit through a plasma enhanced chemical vapor deposition (PECVD) method, a gas flow ratio of $O_2$ to Hexamethyldisiloxane (HMDSO) for depositing the buffer sublayer is that $O_2$:HMDSO<3:1, wherein, a radio frequency power of HMDSO ranges from 200 W to 800 W, a flow rate of HMDSO ranges from 10 sccm to 50 sccm, a radio frequency power of $O_2$ ranges from 200 W to 800 W, and a deposition time of the buffer sublayer ranges from 10 minutes to 50 minutes.

Wherein, the resist sublayer is formed by depositing on the buffer sublayer through a plasma enhanced chemical vapor deposition (PECVD) method, a gas flow ratio of $O_2$ to Hexamethyldisiloxane (HMDSO) for depositing the resist sublayer is that 3:1<$O_2$:HMDSO<18:1, and wherein, a radio frequency power of HMDSO ranges from 200 W to 800 W, a flow rate of HMDSO ranges from 10 sccm to 50 sccm, a radio frequency power of $O_2$ ranges from 200 W to 800 W, a deposition time of the resist sublayer ranges is less than 2 minutes, and a deposition thickness of the resist sublayer ranges from 10 nm to 50 nm.

Wherein, a composition of the first inorganic packaging layer is $SiO_2$, the first inorganic packaging layer is formed by deposition through a plasma enhanced chemical vapor deposition (PECVD) method, a gas flow ratio of $N_2O$ to $SiH_4$ for depositing the first inorganic packaging layer is that $N_2O:SiH_4>2:1$, and wherein, a radio frequency power of $SiH_4$ ranges from 10 W to 100 W, a flow rate of $SiH_4$ ranges from 10 sccm to 50 sccm, a radio frequency power of $N_2O$ ranges from 10 W to 100 W, a deposition time of the first inorganic packaging layer ranges from 10 minutes to 20 minutes, and a deposition thickness of the first inorganic packaging layer ranges from 10 nm to 50 nm.

Wherein, a composition of the first inorganic packaging layer is $SiN_x$, the first inorganic packaging layer is formed by deposition through a plasma enhanced chemical vapor deposition (PECVD) method, a gas flow ratio of $(N_2+NH_3)$ to $SiH_4$ for depositing the first inorganic packaging layer is that $(N_2+NH_3):SiH_4>2:1$, and wherein, a radio frequency power of $SiH_4$ ranges from 10 W to 100 W, a flow rate of SiH4 ranges from 10 sccm to 50 sccm, a radio frequency power of $N_2$ ranges from 10 W to 100 W, a radio frequency power of $NH_3$ ranges from 10 W to 100 W, a deposition time of the first inorganic packaging layer ranges from 10 min to 20 min, and a deposition thickness of the first inorganic packaging layer ranges from 10 nm to 50 nm.

Wherein, a composition of the first inorganic packaging layer is $SiON_x$, the first inorganic packaging layer is formed by deposition through a plasma enhanced chemical vapor deposition (PECVD) method, a gas flow ratio of $(N_2+NH_3+NO_2)$ to $SiH_4$ for depositing the first inorganic packaging layer is that $(N_2+NH_3+NO_2):SiH_4>2:1$, and wherein, a radio frequency power of $SiH_4$ ranges from 10 W to 100 W, a flow rate of $SiH_4$ ranges from 10 sccm to 50 sccm, a radio frequency power of $N_2$ ranges from 10 W to 100 W, a radio frequency power of $NH_3$ ranges from 10 W to 100 W, a deposition time of the first inorganic packaging layer ranges from 10 min to 20 min, and a deposition thickness of the first inorganic packaging layer ranges from 10 nm to 50 nm.

Wherein, after the step of forming an organic packaging layer on the coupling agent unit, the method further comprises: forming a second inorganic packaging layer on the organic packaging layer.

In order to solve above technology problem, another technology adopted by the present invention is: an organic light-emitting device, comprising: a Thin-Film Transistor (TFT) substrate; an Organic Light-Emitting Diode (OLED) layer disposed on the TFT substrate; a first inorganic packaging layer stacked on the OLED layer; a coupling agent unit disposed on the first inorganic packaging layer; and an organic packaging layer disposed on the coupling agent unit; wherein, the organic packaging layer includes a buffer sublayer and a resist sublayer sequentially formed on the coupling agent unit, the coupling agent unit generates chemical reacts with the first inorganic packaging layer and the buffer sublayer in order to increase an adhesive strength between the first inorganic packaging layer and the organic packaging layer.

Wherein, a chemical formula of a composition of the coupling agent unit is $Y(CH)nX_3$, wherein, X represents a hydrolysable group, when hydrolyzing, $Si(OH)_3$ is produced, and X is combined with inorganic substance to produce siloxane; n is a positive integral and ranged from 0 to 3; Y is an organic functional group, and chemically reacts with polymer to produce a hydrogen bond.

Wherein, the X is a methoxy group, a chloro group, an ethoxy group, an acetoxy group, or a methoxy ethoxy; the Y is a vinyl group, an amino group, a methacryloyloxy group, a mercapto group or a urea group.

Wherein, a chemical formula of the organic packaging layer is $S_iO_xC_yH_z$, a thickness of the organic packaging layer ranges from 1000 nm to 5000 nm.

Wherein, the buffer sublayer is formed by depositing on the coupling agent unit through a plasma enhanced chemical vapor deposition (PECVD) method, a gas flow ratio of $O_2$ to Hexamethyldisiloxane (HMDSO) for depositing the buffer sublayer is that $O_2:HMDSO<3:1$, wherein, a radio frequency power of HMDSO ranges from 200 W to 800 W, a flow rate of HMDSO ranges from 10 sccm to 50 sccm, a radio frequency power of $O_2$ ranges from 200 W to 800 W, and a deposition time of the buffer sublayer ranges from 10 minutes to 50 minutes.

Wherein, the resist sublayer is formed by depositing on the buffer sublayer through a plasma enhanced chemical vapor deposition (PECVD) method, a gas flow ratio of $O_2$ to Hexamethyldisiloxane (HMDSO) for depositing the resist sublayer is that $3:1<O_2:HMDSO<18:1$, and wherein, a radio frequency power of HMDSO ranges from 200 W to 800 W, a flow rate of HMDSO ranges from 10 sccm to 50 sccm, a radio frequency power of $O_2$ ranges from 200 W to 800 W, a deposition time of the resist sublayer ranges is less than 2 minutes, and a deposition thickness of the resist sublayer ranges from 10 nm to 50 nm.

Wherein, a composition of the first inorganic packaging layer is $SiO_2$, the first inorganic packaging layer is formed by deposition through a plasma enhanced chemical vapor deposition (PECVD) method, a gas flow ratio of $N_2O$ to $SiH_4$ for depositing the first inorganic packaging layer is that $N_2O:SiH_4>2:1$, and wherein, a radio frequency power of $SiH_4$ ranges from 10 W to 100 W, a flow rate of $SiH_4$ ranges from 10 sccm to 50 sccm, a radio frequency power of $N_2O$ ranges from 10 W to 100 W, a deposition time of the first inorganic packaging layer ranges from 10 minutes to 20 minutes, and a deposition thickness of the first inorganic packaging layer ranges from 10 nm to 50 nm.

Wherein, the OLED layer, the first inorganic packaging layer, the coupling agent unit, the buffer sublayer, and the resist sublayer are sequentially stacked on the TFT substrate.

Wherein, the OLED layer, the first inorganic packaging layer, the buffer sublayer and the resist sublayer are sequentially stacked on the TFT substrate, and the coupling agent unit covers on outer edges of the first inorganic packaging layer and the buffer sublayer.

The beneficial effects of the present invention are: comparing to the conventional art, in a thin-film packaging method and an organic light-emitting device of the present invention, a coupling agent unit is disposed between a first inorganic packaging layer and a buffer sublayer in order to increase an adhesive strength between the first inorganic packaging layer and the organic packaging layer so that they are not easily to be separated, and have a good water and oxygen insulation property.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

Figure 1:
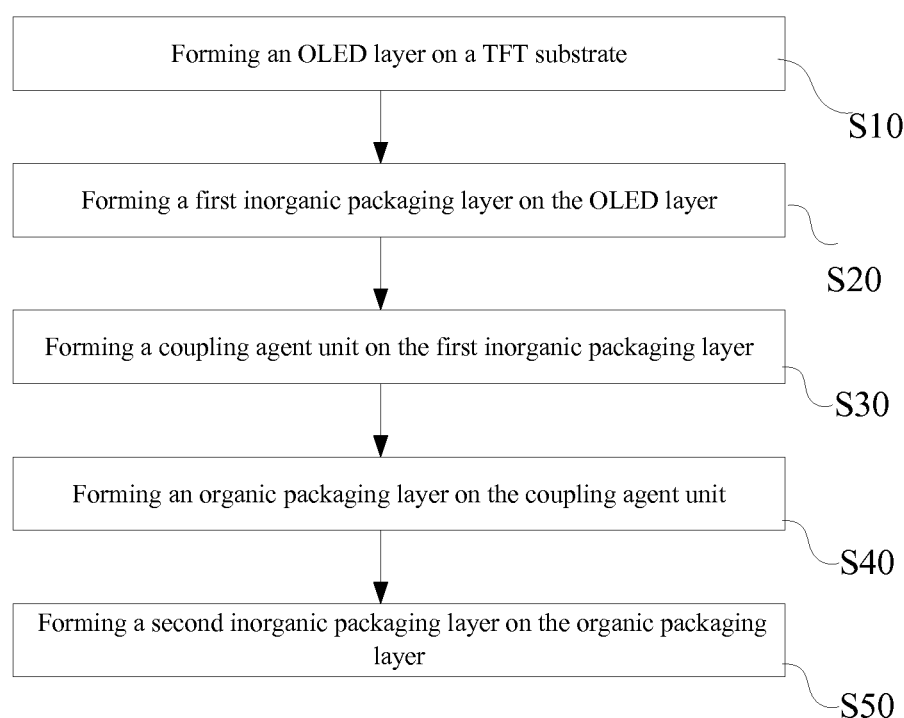
FIG. 1 is a schematic manufacturing process diagram of a thin film packaging method according to an embodiment of the present invention.

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention. With reference to FIG. 1, and FIG. 1 is a schematic manufacturing process diagram of a thin-film packaging method according to an embodiment of the present invention. The thin-film packaging method of the present invention specifically includes following steps:

S10: forming an Organic Light-Emitting-Diode (OLED) layer on a Thin-Film Transistor (TFT) substrate;

Specifically, the present embodiment utilizes a vacuum evaporation method or an ink jet printing method to form the OLED layer stacked and formed on the TFT substrate. When the ink jet printing method is adopted, the OLED layer is completed in an inert environment, and a moisture and oxygen content is less than 10 ppm.

The TFT substrate includes a flexible glass substrate and a TFT formed on the flexible glass substrate. The flexible glass substrate is a thin and transparent glass, and a user can bend the flexible glass substrate easily. The TFT is used for driving the OLED layer. The OLED layer includes a positive electrode sublayer, a hole transport sublayer, an emitting sublayer, an electron transport sublayer and metal cathode sublayer. Wherein, the positive electrode sublayer is electrically connected with a positive terminal of a power source and the metal cathode sublayer is electrically connected with a negative terminal of the power source. When the power source provides an adequate voltage, empty holes in the positive electrode sublayer and electric charges in the cathode sublayer are combined in the emitting sublayer to emit lights. According to the composition of the emitting sublayer, three primary colors of a red color, a green color and a blue color can be generated in order to form base colors such that the OLED layer can emit visible lights.

S20: forming a first inorganic packaging layer on the OLED layer;

Wherein, a composition of the first inorganic packaging layer is $SiO_2$, the first inorganic packaging layer is formed by deposition through a plasma enhanced chemical vapor deposition (PECVD) method. A gas flow ratio of $N_2O$ to $SiH_4$ for depositing the first inorganic packaging layer is that $N_2O:SiH_4>2:1$. Wherein, a radio frequency power of $SiH_4$ ranges from 10 W to 100 W. A flow rate of $SiH_4$ ranges from 10 sccm to 50 sccm, a radio frequency power of $N_2O$ ranges from 10 W to 100 W, a deposition time of the first inorganic packaging layer ranges from 10 minutes to 20 minutes, a deposition thickness of the first inorganic packaging layer ranges from 10 nm to 50 nm, and a gas pressure of the reaction chamber ranges from 50 Pa to 500 Pa.

Of course, in another embodiment, a composition of the first inorganic packaging layer can also be $SiN_x$, the first inorganic packaging layer is formed by deposition through a plasma enhanced chemical vapor deposition (PECVD) method. A gas flow ratio of $(N_2+NH_3)$ to $SiH_4$ for depositing the first inorganic packaging layer is that $(N_2+NH_3):SiH_4>2:1$. Wherein, a radio frequency power of $SiH_4$ ranges from 10 W to 100 W. A flow rate of $SiH_4$ ranges from 10 sccm to 50 sccm, a radio frequency power of $N_2$ ranges from 10 W to 100 W, a radio frequency power of $NH_3$ ranges from 10 W to 100 W, a deposition time of the first inorganic packaging layer ranges from 10 minutes to 20 minutes, a deposition thickness of the first inorganic packaging layer ranges from 10 nm to 50 nm, and a gas pressure of the reaction chamber ranges from 50 Pa to 500 Pa.

Of course, in another embodiment, a composition of the first inorganic packaging layer can also be $SiON_x$, the first inorganic packaging layer is formed by deposition through a plasma enhanced chemical vapor deposition (PECVD) method. A gas flow ratio of $(N_2+NH_3+NO_2)$ to $SiH_4$ for depositing the first inorganic packaging layer is that $(N_2+NH_3+NO_2):SiH_4>2:1$. Wherein, a radio frequency power of $SiH_4$ ranges from 10 W to 100 W. A flow rate of $SiH_4$ ranges from 10 sccm to 50 sccm, a radio frequency power of $N_2$ ranges from 10 W to 100 W, a radio frequency power of $NH_3$ ranges from 10 W to 100 W, a deposition time of the first inorganic packaging layer ranges from 10 minutes to 20 minutes, a deposition thickness of the first inorganic packaging layer ranges from 10 nm to 50 nm, and a gas pressure of the reaction chamber ranges from 50 Pa to 500 Pa.

S30: forming a coupling agent unit on the first inorganic packaging layer; wherein, a chemical formula of a composition of the coupling agent unit is $Y(CH)nX_3$, wherein, X represents a hydrolysable group, when hydrolyzing, $Si(OH)_3$ is produced, and X is combined with inorganic substance to produce siloxane. Wherein, n is a positive integral and ranged from 0 to 3. Y is an organic functional group, and chemically reacts with polymer to produce a hydrogen bond and dissolved in. X can be a methoxy group, a chloro group, an ethoxy group, an acetoxy group, or a methoxy ethoxy. Y can be a vinyl group, an amino group, a methacryloyloxy group, a mercapto group or a urea group, and the Y can react with an organic substance.

The coupling agent unit can formed and stacked on the first inorganic packaging layer through a vacuum evaporation film forming method or a spin coating film forming method. If utilizing the vacuum evaporation film forming method to form the coupling agent unit, a TFT substrate temperature is less than 100° C., a requirement for vacuum degree is 5×10E-5Pa. If utilizing the spin coating film forming method to form the coupling agent unit, a moisture and oxygen content is controlled to be less than 10 ppm. The coupling agent unit is cured and formed as a film through a baking process, and a baking temperature is less than 100° C. In the present embodiment, a thickness of the coupling agent unit is less than 100 nm.

In the present embodiment, an outer edge of the coupling agent unit is flush with an outer edge of the first inorganic packaging layer. Of course, in another embodiment, the outer edge of the coupling agent unit can be greater than or less than the outer edge of the first inorganic packaging layer.

S40: forming an organic packaging layer on the coupling agent unit;

The organic packaging layer includes a buffer sublayer and a resist sublayer sequentially formed on the coupling agent unit. The coupling agent unit generates chemical reacts with the first inorganic packaging layer and the buffer sublayer in order to increase an adhesive strength between the first inorganic packaging layer and the organic packaging layer. Wherein, a chemical formula of the organic packaging layer is $SiO_xC_yH_z$, a thickness of the organic packaging layer ranges from 1000 nm to 5000 nm.

The buffer sublayer is mainly formed by an organic material, and the buffer sublayer can be formed by depositing on the coupling agent unit through a plasma enhanced chemical vapor deposition (PECVD) method. A gas flow ratio of $O_2$ to Hexamethyldisiloxane (HMDSO) for depositing the buffer sublayer is that $O_2$:HMDSO<3:1. Wherein, a radio frequency power of HMDSO ranges from 200 W to 800 W. A flow rate of HMDSO ranges from 10 sccm to 50 sccm, a radio frequency power of $O_2$ ranges from 200 W to 800 W, a deposition time of the buffer sublayer ranges from 10 minutes to 50 minutes, and a gas pressure of the reaction chamber ranges from 30 Pa to 200 Pa.

The resist sublayer is made of an organic material such as $SiO_2$, and so on. The resist sublayer can be formed by depositing on the buffer sublayer through a plasma enhanced chemical vapor deposition (PECVD) method. A gas flow ratio of $O_2$ to Hexamethyldisiloxane (HMDSO) for depositing the resist sublayer is that 3:1<$O_2$:HMDSO<18:1. Wherein, a radio frequency power of HMDSO ranges from 200 W to 800 W. A flow rate of HMDSO ranges from 10 sccm to 50 sccm. A radio frequency power of $O_2$ ranges from 200 W to 800 W. A deposition time of the resist sublayer ranges is less than 2 minutes. A deposition thickness of the resist sublayer ranges from 10 nm to 50 nm, and a gas pressure of the reaction chamber ranges from 30 Pa to 200 Pa.

In the present embodiment, the resist sublayer is stacked on the coupling agent unit. An outer edge of the resist sublayer is flush with an outer edge of the coupling agent layer. Of course, in another embodiment, the outer edge of the resist sublayer can be greater than or less than the outer edge of the coupling agent unit.

S50: forming a second inorganic packaging layer on the organic packaging layer.

The second inorganic packaging layer is stacked and formed on the organic packaging layer, and the second inorganic packaging layer is also covered on outer edges of the organic packaging layer, the coupling agent unit, the first inorganic packaging layer and the OLED layer.

In another embodiment, after the step S50, the steps S10-S50 can be repeated to form multiple thin-film packaging devices.

A molecular structure of the coupling agent unit (Y(CH)$nX_3$) of the present embodiment has two chemical functional groups. That is, a hydrolysable group X and an organic functional group Y. X is a group that has affinity for an inorganic substance, and easily to react chemically with a surface of the inorganic substance. Y group is an organophilic group, which can generate a chemical reaction with high molecular polymer or produce a hydrogen bond and dissolved in. X group generate a chemical reaction with the first inorganic packaging layer, and Y group generate a chemical reaction with the buffer sublayer in order to improve the interface function between the inorganic substance and the organic substance so as to increase an adhesion between the inorganic layer and the organic layer.

It should be noted that in the process of forming the organic packaging layer using the plasma enhanced chemical vapor deposition (PECVD) method, through controlling an oxidant content (that is, $O_2$ and HMDSO), on one hand, a contact portion of the buffer sublayer and the coupling agent can keep a buffer property to wrap small impurity particles, fill small holes generated by the first inorganic packaging layer, decrease film stress, realize the planarization, and increase bendable times of the flexible glass substrate; on the other hand, a contact portion of the buffer sublayer and the next first inorganic packaging layer is more closed to an inorganic property so as to increase the adhesion between the buffer sublayer and the first inorganic packaging layer.

Figure 2:
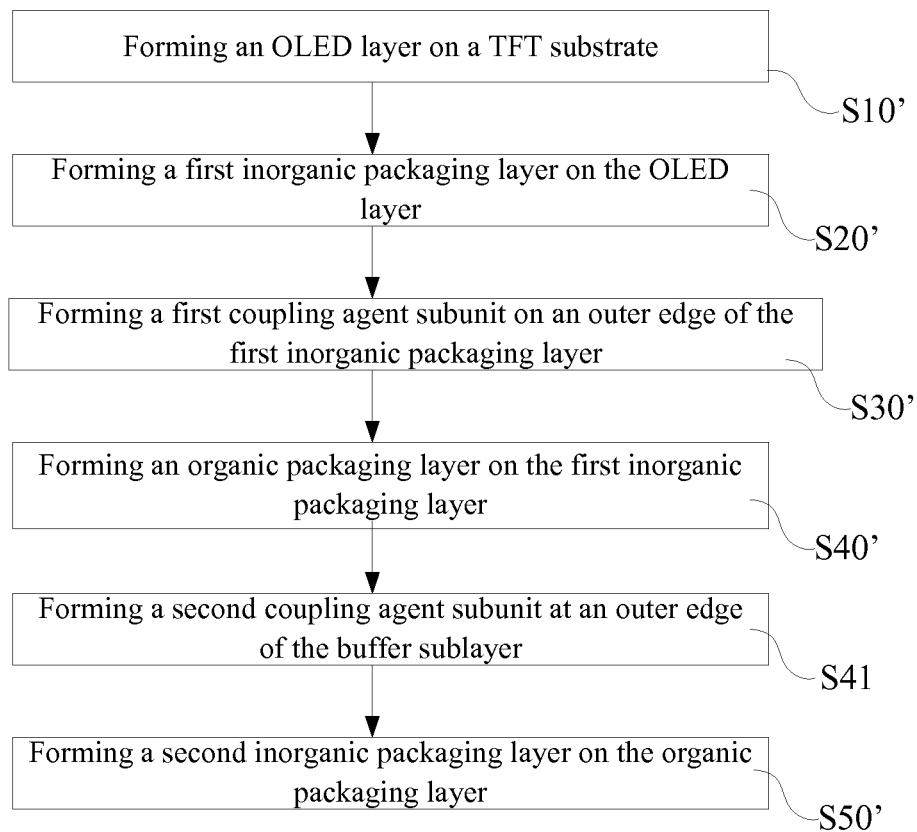
FIG. 2 is a schematic manufacturing process diagram of a thin film packaging method according to another embodiment of the present invention.

FIG. 2 is a schematic manufacturing process diagram of a thin film packaging method according to another embodiment of the present invention. The difference between the present embodiment and the above embodiment is that a forming location of the coupling agent unit. A thin-film packaging method of the present embodiment specifically includes following steps:

Step S10': forming an Organic Light-Emitting Diode (OLED) layer on a thin-film transistor (TFT) substrate;

Step S20': forming a first inorganic packaging layer on the OLED layer; The first inorganic packaging layer of the present embodiment is formed on the OLED layer, and covered on an outer edge of the OLED layer;

Step S30': forming a first coupling agent subunit on an outer edge of the first inorganic packaging layer;

In the present embodiment, the first coupling agent subunit is not stacked and formed on the first inorganic packaging layer, but be formed on the outer edge of the first inorganic packaging layer;

Step S40': forming an organic packaging layer on the first inorganic packaging layer;

In the present embodiment, the organic packaging layer includes a buffer sublayer and a resist sublayer sequentially formed on the first inorganic packaging layer;

Step S41: forming a second coupling agent subunit at an outer edge of the buffer sublayer;

The second coupling agent subunit is formed at the outer edge of the buffer sublayer, and is extended from top to bottom to the first coupling agent subunit in order to be integrated with the first coupling agent subunit. The first coupling agent subunit and the second coupling subunit respectively generate chemical reactions with the first inorganic packaging layer and the buffer sublayer in order to increase an adhesive strength between the first inorganic packaging layer and the buffer sublayer.

Step S50': forming a second inorganic packaging layer on the organic packaging layer.

Figure 3:
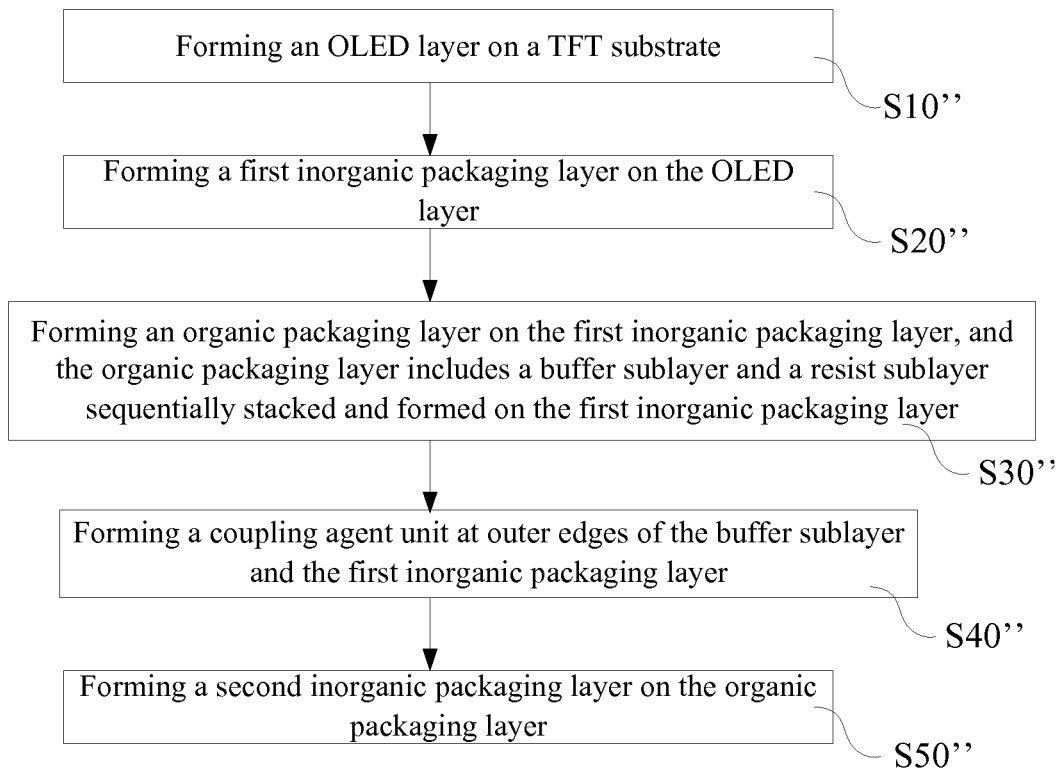
FIG. 3 is a schematic manufacturing process diagram of a thin film packaging method according to another embodiment of the present invention.

With reference to FIG. 3, and FIG. 3 is a schematic manufacturing process diagram of a thin film packaging method according to another embodiment of the present invention. The present embodiment and the above embodiment are similar. The difference is that a forming location of the coupling agent unit. A thin-film packaging method of the present embodiment specifically includes following steps:

Step S10": forming an Organic Light-Emitting Diode (OLED) layer on a thin-film transistor (TFT) substrate;

Step S20": forming a first inorganic packaging layer on the OLED layer;

Step S30": forming an organic packaging layer on the first inorganic packaging layer, and the organic packaging layer includes a buffer sublayer and a resist sublayer sequentially stacked and formed on the first inorganic packaging layer;

An outer edge of the resist sublayer is flush with an outer edge of the first inorganic packaging layer. Of course, in another embodiment, the outer edge of the first inorganic packaging layer can be greater than the outer edge of the resist sublayer such that an upper surface of the first inorganic packaging layer forms a space portion.

Step S40": forming a coupling agent unit at outer edges of the buffer sublayer and the first inorganic packaging layer.

In the present embodiment, the outer edge of the buffer sublayer and an outer edge of the first inorganic packaging layer are both covered with the coupling agent unit, and the coupling agent unit generates chemical reactions with the first inorganic packaging layer and the buffer sublayer in order to increase an adhesive strength between the first inorganic packaging layer and the organic packaging layer.

Of course, when the outer edge of the first inorganic packaging layer is greater than the outer edge of the buffer sublayer, the coupling agent unit covers on the outer edge of the first inorganic packaging layer, and extends to the space portion such that the first inorganic packaging layer and the buffer sublayer both generate chemical reactions with the second inorganic packaging layer.

S50": forming a second inorganic packaging layer on the organic packaging layer.

Figure 4:
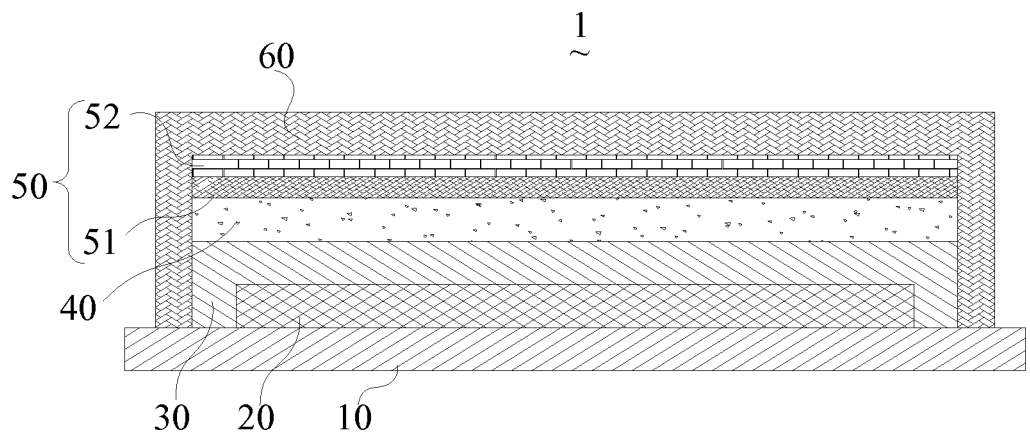
FIG. 4 is a schematic cross-sectional view of an organic light-emitting device according to an embodiment of the present invention.

With reference to FIG. 4, and FIG. 4 is a schematic cross-sectional view of an organic light-emitting device according to an embodiment of the present invention. The present invention also provides an organic light-emitting device 1, which is manufactured by the above thin-film packaging method.

The organic light-emitting device 1 of the present invention includes a TFT substrate 10, an OLED layer 20, a first inorganic packaging layer 30, a coupling agent unit 40 and an organic packaging layer 50.

The OLED layer 20 is disposed on the TFT substrate 10. The first inorganic packaging layer 30 is stacked on the OLED layer 20. The coupling agent unit 40 is stacked on the first inorganic packaging layer 30. The organic packaging layer 50 is disposed on the coupling agent unit 40. Wherein, the organic packaging layer 50 has a buffer sublayer 51 and a resist sublayer 52 sequentially stacked on the coupling agent unit 40. The coupling agent unit 40 generates chemical reactions with the first inorganic packaging layer 30 and the buffer sublayer 51 in order to increase an adhesive strength between the first inorganic packaging layer 30 and the organic packaging layer 50.

Figure 5:
FIG. 5 is a schematic diagram of a TFT substrate of the organic light-emitting device shown in FIG. 4.

With reference to FIG. 5, and FIG. 5 is a schematic diagram of a TFT substrate of the organic light-emitting device shown in FIG. 4. The OLED layer 20 of the present embodiment is formed and stacked on the TFT substrate through a vacuum evaporation method or an ink-jet printing method. Wherein, a moisture and oxygen content of the OLED layer 20 is less than 10 ppm. The TFT substrate 10 includes a flexible glass substrate 11 and a TFT 12 disposed on the flexible glass substrate 11. The flexible glass substrate 11 is a thin and transparent glass. A user can bend the flexible glass substrate 11 easily. The TFT 12 is used for driving the OLED layer.

Figure 6:
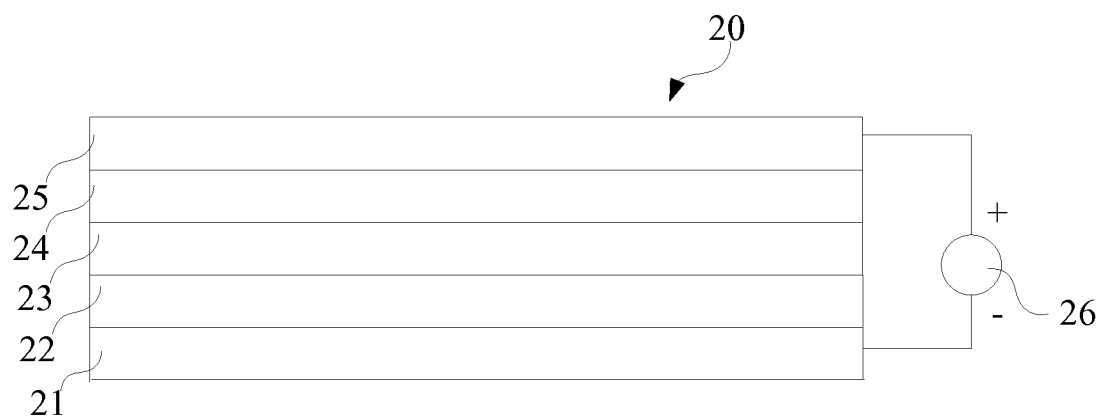
FIG. 6 is a schematic diagram of the OLED layer of the organic light-emitting device shown in FIG. 4.

With reference to FIG. 6, and FIG. 6 is a schematic diagram of the OLED layer of the organic light-emitting device 1 shown in FIG. 4. The OLED layer 20 includes a positive electrode sublayer 21, a hole transport sublayer 22, an emitting sublayer 23, an electron transport sublayer 24 and metal cathode sublayer 25 sequentially stacked on the flexible glass substrate 11. Wherein, the positive electrode sublayer 21 is electrically connected with a positive terminal of a power source 26, and the metal cathode sublayer 25 is electrically connected with a negative terminal of the power source 26. When the power source 26 provides with an adequate voltage, empty holes in the positive electrode sublayer 21 and electric charges in the cathode sublayer 25 are combined in the emitting sublayer 23 to emit lights. According to the composition of the emitting sublayer 23, three primary colors of a red color, a green color and a blue color can be generated in order to form base colors such that the OLED layer 20 can emit visible light.

Wherein, a composition of the first inorganic packaging layer 30 is $SiO_2$, the first inorganic packaging layer 30 is formed by deposition through a plasma enhanced chemical vapor deposition (PECVD) method. A gas flow ratio of $N_2O$ to $SiH_4$ for depositing the first inorganic packaging layer 30 is that $N_2O:SiH_4>2:1$. Wherein, a radio frequency power of $SiH_4$ ranges from 10 W to 100 W. A flow rate of $SiH_4$ ranges from 10 sccm to 50 sccm, a radio frequency power of $N_2O$ ranges from 10 W to 100 W, a deposition time of the first inorganic packaging layer 30 ranges from 10 minutes to 20 minutes, a deposition thickness of the first inorganic packaging layer 30 ranges from 10 nm to 50 nm, and a gas pressure of the reaction chamber ranges from 50 Pa to 500 Pa.

Of course, in another embodiment, a composition of the first inorganic packaging layer 30 can also be $SiN_x$, the first inorganic packaging layer is formed by deposition through a plasma enhanced chemical vapor deposition (PECVD) method. A gas flow ratio of $(N_2+NH_3)$ to $SiH_4$ for depositing the first inorganic packaging layer 30 is that $(N_2+NH_3):SiH_4>2:1$. Wherein, a radio frequency power of $SiH_4$ ranges from 10 W to 100 W. A flow rate of $SiH_4$ ranges from 10 sccm to 50 sccm, a radio frequency power of $N_2$ ranges from 10 W to 100 W, a radio frequency power of $NH_3$ ranges from 10 W to 100 W, a deposition time of the first inorganic packaging layer 30 ranges from 10 minutes to 20 minutes, a deposition thickness of the first inorganic packaging layer 30 ranges from 10 nm to 50 nm, and a gas pressure of the reaction chamber ranges from 50 Pa to 500 Pa.

Of course, in another embodiment, a composition of the first inorganic packaging layer 30 can also be $SiON_x$, the first inorganic packaging layer 30 is formed by deposition through a plasma enhanced chemical vapor deposition (PECVD) method. A gas flow ratio of $(N_2+NH_3+NO_2)$ to $SiH_4$ for depositing the first inorganic packaging layer 30 is that $(N_2+NH_3+NO_2):SiH_4>2:1$. Wherein, a radio frequency power of $SiH_4$ ranges from 10 W to 100 W. A flow rate of $SiH_4$ ranges from 10 sccm to 50 sccm, a radio frequency power of $N_2$ ranges from 10 W~100 W, a radio frequency power of $NH_3$ ranges from 10 W to 100 W, a deposition time of the first inorganic packaging layer 30 ranges from 10 minutes to 20 minutes, a deposition thickness of the first inorganic packaging layer 30 ranges from 10 nm to 50 nm, and a gas pressure of the reaction chamber ranges from 50 Pa to 500 Pa.

A chemical formula of a composition of the coupling agent unit 40 of the present embodiment is $Y(CH)nX_3$, wherein, X represents a hydrolysable group, when hydrolyzing, $Si(OH)_3$ is produced, and X is combined with inorganic substance to produce siloxane. Wherein, n is a positive integral and ranged from 0 to 3. Y is an organic functional group, and chemically reacts with polymer to produce hydrogen bond and dissolved in. X can be a methoxy group, a chloro group, an ethoxy group, an acetoxy group, or a methoxy ethoxy. Y can be a vinyl group, an amino group, a methacryloyloxy group, a mercapto group or a urea group, and the Y can react with an organic substance.

The coupling agent unit can formed and stacked on the first inorganic packaging layer through a vacuum evaporation film forming method or a spin coating film forming method. If utilizing the vacuum evaporation film forming method to form the coupling agent unit, a TFT substrate temperature is less than 100° C., a requirement for vacuum degree is 5×10E-5 Pa. If utilizing the spin coating film forming method to form the coupling agent unit, a moisture and oxygen content is controlled to be less than 10 ppm. The coupling agent unit is cured and formed as a film through a baking process, and a baking temperature is less than 100° C. In the present embodiment, a thickness of the coupling agent unit is less than 100 nm.

In the present embodiment, the coupling agent unit 40 is stacked on the first inorganic packaging layer 30. A contour of the coupling agent unit 40 is the same as a contour of the first inorganic packaging layer 30. That is, an outer edge of the coupling agent unit 40 is flush with an outer edge of the first inorganic packaging layer 30. Of course, in another embodiment, the outer edge of the coupling agent unit 40 can be greater than or less than the outer edge of the first inorganic packaging layer 30.

The organic packaging layer 50 includes a buffer sublayer 51 and a resist sublayer 52 sequentially formed on the coupling agent unit 40. The coupling agent unit 40 generates chemical reacts with the first inorganic packaging layer 30 and the buffer sublayer 51 in order to increase an adhesive strength between the first inorganic packaging layer 30 and the organic packaging layer 50. Wherein, a chemical formula of the organic packaging layer is $SiO_xC_yH_z$, a thickness of the organic packaging layer 50 ranges from 1000 nm to 5000 nm.

The buffer sublayer 51 can be formed by depositing on the coupling agent unit 40 through a plasma enhanced chemical vapor deposition (PECVD) method. A gas flow ratio of $O_2$ to Hexamethyldisiloxane (HMDSO) for depositing the buffer sublayer is that $O_2$:HMDSO<3:1. Wherein, a radio frequency power of HMDSO ranges from 10 W to 100 W. A flow rate of HMDSO ranges from 10 sccm to 50 sccm. A radio frequency power of $O_2$ ranges from 200 W to 800 W. A deposition time of the buffer sublayer 51 ranges from 10 minutes to 50 minutes. A gas pressure of the reaction chamber ranges from 30 Pa to 200 Pa.

The resist sublayer 52 is made of an organic material such as $SiO_2$, and so on. The resist sublayer 52 can be formed by depositing on the buffer sublayer 51 through a plasma enhanced chemical vapor deposition (PECVD) method. A gas flow ratio of $O_2$ to Hexamethyldisiloxane (HMDSO) for depositing the resist sublayer 51 is that $3:1<O_2$:HMDSO<18:1. Wherein, a radio frequency power of HMDSO ranges from 200 W to 800 W. A flow rate of HMDSO ranges from 10 sccm to 50 sccm. A radio frequency power of $O_2$ ranges from 200 W to 800 W. A deposition time of the resist sublayer 52 ranges is less than 2 minutes. A deposition thickness of the resist sublayer 52 ranges from 10 nm to 50 nm, and a gas pressure of the reaction chamber ranges from 30 Pa to 200 Pa.

In the present embodiment, a contour of the buffer sublayer 51 is the same as a contour of the coupling agent unit 40. Of course, in another embodiment, an area of an outer surface of the buffer sublayer 51 can be greater than or less than an area of an outer surface of the coupling agent unit 40.

In another embodiment, the light-emitting device 1 further includes a second inorganic packaging layer 60 stacked on the organic packaging layer. The second inorganic packaging layer 60 covers on outer edges of the organic packaging layer 50, the coupling agent unit 40, the first inorganic packaging layer 30, and the OLED layer 20.

Figure 7:
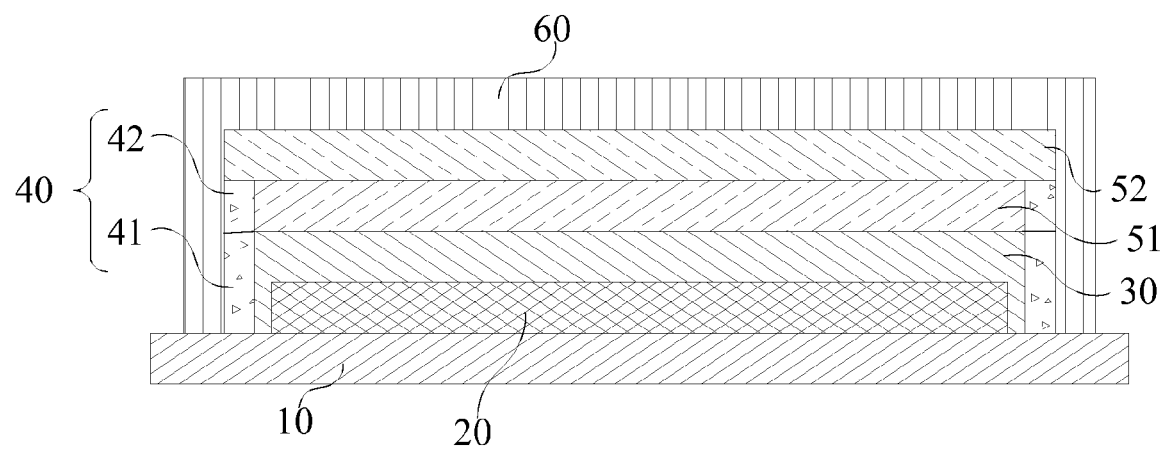
FIG. 7 is a schematic cross-sectional view of an organic light-emitting device according to another embodiment of the present invention.

FIG. 7 is a schematic cross-sectional view of an organic light-emitting device according to another embodiment of the present invention. The present embodiment and the above embodiment are similar. The difference is that a forming location of the coupling agent unit 40.

The organic light-emitting device 1 of the present invention includes a coupling agent unit 40 and an OLED layer 20, a first inorganic packaging layer 30, a buffer sublayer 51 and a resist sublayer 52 sequentially disposed on a TFT substrate 10.

The coupling agent unit 40 of the present embodiment includes a first coupling agent subunit 41 and a second coupling agent subunit 42. The first coupling agent subunit 41 covers on an outer edge of the first inorganic packaging layer 30. The second coupling agent subunit 42 covers on an outer edge of the buffer sublayer 51. The first coupling agent subunit 41 and the second coupling agent subunit 42 are formed integrally. The first coupling agent subunit 41 and the second coupling agent subunit 42 respectively generate chemical reactions with the first inorganic packaging layer 30 and the buffer sublayer 51 in order to increase an adhesive strength between the first inorganic packaging layer 30 and the organic packaging layer 50. It should be noted that the first inorganic packaging layer 30 is stacked on the OLED layer 20, and covers on an outer edge of the OLED layer 20.

Figure 7A:
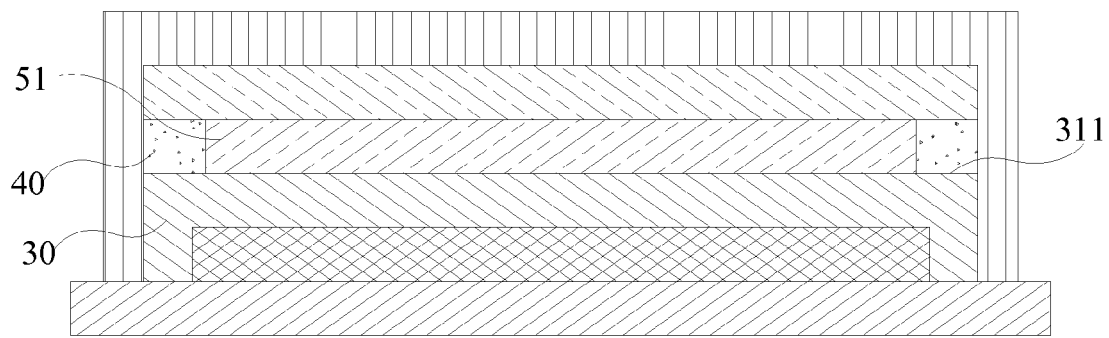
FIG. 7a is a schematic cross-sectional view of an organic light-emitting device according to another embodiment of the present invention.

An area of a lower surface of the buffer sublayer 51 can be the same as an area of an upper surface of the first inorganic packaging layer 30. That is, the outer edge of the buffer sublayer 51 is flush with the outer edge of the first inorganic packaging layer 30. Of course, in another embodiment as shown in FIG. 7a, an area of a lower surface of the buffer sublayer 51 can be smaller than an area of an upper surface of the first inorganic packaging layer 30 in order to form a space portion 311 such that the first inorganic packaging layer 30 and the buffer sublayer 51 both generate chemical reactions with the coupling agent unit 40.

Figure 8:
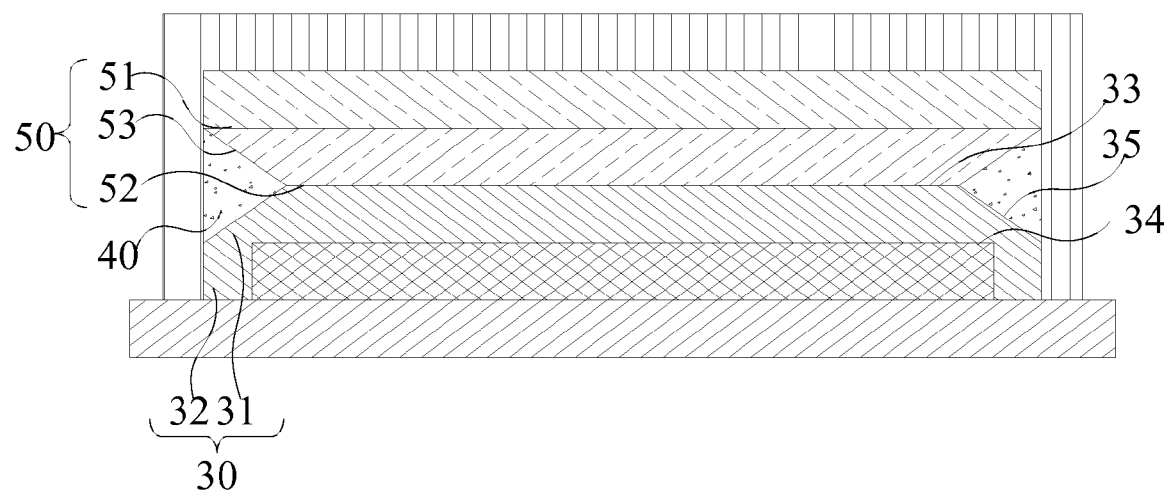
FIG. 8 is a schematic cross-sectional view of an organic light-emitting device according to another embodiment of the present invention.

With reference to FIG. 8, and FIG. 8 is a schematic cross-sectional view of an organic light-emitting device according to another embodiment of the present invention. The present embodiment and the above embodiment are similar. The difference is that a forming location of the coupling agent unit 40.

The organic light-emitting device 1 of the present invention includes a coupling agent unit 40 and an OLED layer 20, a first inorganic packaging layer 30, a buffer sublayer 51 and a resist sublayer 52 sequentially disposed on a TFT substrate 10.

The first inorganic packaging layer 30 includes a taper-platform portion 31 and a covering portion 32. The taper-platform portion 31 is frustum-shaped, and the buffer sublayer 51 is inversely frustum-shaped. That is, the taper-platform portion 31 and the buffer sublayer 51 form a hourglass shape which is large at two terminals and small in the middle. Specifically, taper-platform portion 31 includes a first upper plane 33, a first lower plane 34 and a first inclined plane 35.

The first upper plane 33 and the first lower plane 34 are disposed in parallel and with an interval. The first inclined plane 35 is extended from an outer edge of the first upper plane 33 to an outer edge of the first lower plane 34.

Wherein, an area of the first upper plane 33 is smaller than an area of the first lower plane 34 such that an included angle between first inclined plane 35 and the first lower plane 34 is an acute angle. The buffer sublayer 51 includes a second upper plane 511, a second lower plane 512 and a second inclined plane 513. The second upper plane 511 and the second lower plane 512 are disposed in parallel and at an interval. The second inclined plane 513 is extended from an outer edge of the second upper plane 511 to an outer edge of the second lower plane 512. Wherein, an area of the second upper plane 511 is larger than an area of the second lower plane 512 such that an included angle formed between the second inclined plane 513 and the second lower plane 512 is an obtuse angle. The first inclined plane 35 and the second inclined plane 513 form a notch. The coupling agent unit 40 is disposed in the notch. Wherein, the coupling agent unit 40 generates chemical reactions with the first inclined plane 35 and second inclined plane 513 in order to increase an adhesive strength between the first inorganic packaging layer 30 and the organic packaging layer 50.

The present invention also provides a display device including at least one of the above light-emitting devices 1.

The thin-film packaging method and the organic light-emitting device 1 of the present invention dispose a coupling agent unit 40 between the first inorganic packaging layer 30 and the buffer sublayer 51 in order to increase an adhesive strength between the first inorganic packaging layer 30 and the organic packaging layer 50 so that the inorganic packaging layer 30 and the organic packaging layer 50 are not easily to be separated, and have a good water and oxygen insulation property.

It should be noted that the terms of "first", "second", "upper", "lower, "left" and "right" mentioned in the embodiments of the present invention are based on text symbols adopted. In an actual application, the present invention is not limited, and the terms are interchangeably.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A thin-film packaging method, comprising following steps:
    forming an Organic Light-Emitting-Diode (OLED) layer on a Thin-Film-Transistor (TFT) substrate;
    forming a first inorganic packaging layer on the OLED layer;
    forming a coupling agent unit on the first inorganic packaging layer; and
    forming an organic packaging layer on the coupling agent unit; wherein, the organic packaging layer includes a buffer sublayer and a resist sublayer sequentially formed on the coupling agent unit, the coupling agent unit generates chemical reacts with the first inorganic packaging layer and the buffer sublayer in order to increase an adhesive strength between the first inorganic packaging layer and the organic packaging layer;
    wherein, a chemical formula of a composition of the coupling agent unit is $Y(CH)nX_3$, wherein, X represents a hydrolysable group, when hydrolyzing, $Si(OH)_3$ is produced, and X is combined with inorganic substance to produce siloxane; n is a positive integral and ranged from 0 to 3; Y is an organic functional group, and chemically reacts with polymer to produce a hydrogen bond;
    wherein, a chemical formula of the organic packaging layer is $SiOxCyHz$, a thickness of the organic packaging layer ranges from 1000 nm to 5000 nm; and
    wherein, the buffer sublayer is formed by depositing on the coupling agent unit through a plasma enhanced chemical vapor deposition (PECVD) method, a gas flow ratio of O2 to Hexamethyldisiloxane (HMDSO) for depositing the buffer sublayer is that O2:HMDSO<3:1, wherein, a radio frequency power of HMDSO ranges from 200 W to 800 W, a flow rate of HMDSO ranges from 10 sccm to 50 sccm, a radio frequency power of $O_2$ ranges from 200 W to 800 W, and a deposition time of the buffer sublayer ranges from 10 minutes to 50 minutes.

2. A thin-film packaging method, comprising following steps:
    forming an Organic Light-Emitting Diode (OLED) layer on a Thin-Film Transistor (TFT) substrate;
    forming a first inorganic packaging layer on the OLED layer;
    forming a coupling agent unit on the first inorganic packaging layer; and
    forming an organic packaging layer on the coupling agent unit; wherein, the organic packaging layer includes a buffer sublayer and a resist sublayer sequentially formed on the coupling agent unit, the coupling agent unit generates chemical reacts with the first inorganic packaging layer and the buffer sublayer in order to increase an adhesive strength between the first inorganic packaging layer and the organic packaging layer.

3. The thin-film packaging method according to claim 1, wherein, a chemical formula of a composition of the coupling agent unit is $Y(CH)nX_3$, wherein, X represents a hydrolysable group, when hydrolyzing, $Si(OH)_3$ is produced, and X is combined with inorganic substance to produce siloxane; n is a positive integral and ranged from 0 to 3; Y is an organic functional group, and chemically reacts with polymer to produce a hydrogen bond.

4. The thin-film packaging method according to claim 3, wherein, the X is a methoxy group, a chloro group, an ethoxy group, a acetoxy group, or a methoxy ethoxy; the Y is a vinyl group, an amino group, a methacryloyloxy group, a mercapto group or a urea group.

5. The thin-film packaging method according to claim 2, wherein, a chemical formula of the organic packaging layer is $S_tO_xC_yH_z$, a thickness of the organic packaging layer ranges from 1000 nm to 5000 nm.

6. The thin-film packaging method according to claim 5, wherein, the buffer sublayer is formed by depositing on the coupling agent unit through a plasma enhanced chemical vapor deposition (PECVD) method, a gas flow ratio of $O_2$ to Hexamethyldisiloxane (HMDSO) for depositing the buffer sublayer is that $O_2$:HMDSO<3:1, wherein, a radio frequency power of HMDSO ranges from 200 W to 800 W, a flow rate of HMDSO ranges from 10 sccm to 50 sccm, a radio frequency power of $O_2$ ranges from 200 W to 800 W, and a deposition time of the buffer sublayer ranges from 10 minutes to 50 minutes.

7. The thin-film packaging method according to claim 6, wherein, the resist sublayer is formed by depositing on the buffer sublayer through a plasma enhanced chemical vapor deposition (PECVD) method, a gas flow ratio of $O_2$ to Hexamethyldisiloxane (HMDSO) for depositing the resist sublayer is that 3:1<$O_2$:HMDSO<18:1, and wherein, a radio frequency power of HMDSO ranges from 200 W to 800 W, a flow rate of HMDSO ranges from 10 sccm to 50 sccm, a radio frequency power of $O_2$ ranges from 200 W to 800 W, a deposition time of the resist sublayer ranges is less than 2 minutes, and a deposition thickness of the resist sublayer ranges from 10 nm to 50 nm.

8. The thin-film packaging method according to claim 2, wherein, a composition of the first inorganic packaging layer is $SiO_2$, the first inorganic packaging layer is formed by deposition through a plasma enhanced chemical vapor deposition (PECVD) method, a gas flow ratio of $N_2O$ to $SiH_4$ for depositing the first inorganic packaging layer is that $N_2O$: $SiH_4$>2:1, and wherein, a radio frequency power of $SiH_4$ ranges from 10 W to 100 W, a flow rate of $SiH_4$ ranges from 10 sccm to 50 sccm, a radio frequency power of $N_2O$ ranges from 10 W to 100 W, a deposition time of the first inorganic packaging layer ranges from 10 minutes to 20 minutes, and a deposition thickness of the first inorganic packaging layer ranges from 10 nm to 50 nm.

9. The thin-film packaging method according to claim 2, wherein, a composition of the first inorganic packaging layer is $SiN_x$, the first inorganic packaging layer is formed by deposition through a plasma enhanced chemical vapor deposition (PECVD) method, a gas flow ratio of $(N_2+NH_3)$ to $SiH_4$ for depositing the first inorganic packaging layer is that $(N_2+NH_3):SiH_4$>2:1, and wherein, a radio frequency power of $SiH_4$ ranges from 10 W to 100 W, a flow rate of $SiH_4$ ranges from 10 sccm to 50 sccm, a radio frequency power of $N_2$ ranges from 10 W to 100 W, a radio frequency power of $NH_3$ ranges from 10 W to 100 W, a deposition time of the first inorganic packaging layer ranges from 10 min to 20 min, and a deposition thickness of the first inorganic packaging layer ranges from 10 nm to 50 nm.

10. The thin-film packaging method according to claim 2, wherein, a composition of the first inorganic packaging layer is $SiON_x$, the first inorganic packaging layer is formed by deposition through a plasma enhanced chemical vapor deposition (PECVD) method, a gas flow ratio of $(N_2+NH_3+NO_2)$ to $SiH_4$ for depositing the first inorganic packaging layer is that $(N_2+NH_3+NO_2):SiH_4$>2:1, and wherein, a radio frequency power of $SiH_4$ ranges from 10 W to 100 W, a flow rate of $SiH_4$ ranges from 10 sccm to 50 sccm, a radio frequency power of $N_2$ ranges from 10 W to 100 W, a radio frequency power of $NH_3$ ranges from 10 W to 100 W, a deposition time of the first inorganic packaging layer ranges from 10 min to 20 min, and a deposition thickness of the first inorganic packaging layer ranges from 10 nm to 50 nm.

11. The thin-film packaging method according to claim 2, wherein, after the step of forming an organic packaging layer on the coupling agent unit, the method further comprises:
forming a second inorganic packaging layer on the organic packaging layer.

12. An organic light-emitting device, comprising:
a Thin-Film Transistor (TFT) substrate;
an Organic Light-Emitting Diode (OLED) layer disposed on the TFT substrate;
a first inorganic packaging layer stacked on the OLED layer;
a coupling agent unit disposed on the first inorganic packaging layer; and
an organic packaging layer disposed on the coupling agent unit; wherein, the organic packaging layer includes a buffer sublayer and a resist sublayer sequentially formed on the coupling agent unit, the coupling agent unit generates chemical reacts with the first inorganic packaging layer and the buffer sublayer in order to increase an adhesive strength between the first inorganic packaging layer and the organic packaging layer.

13. The organic light-emitting device according to claim 12, wherein, a chemical formula of a composition of the coupling agent unit is $Y(CH)nX_3$, wherein, X represents a hydrolysable group, when hydrolyzing, $Si(OH)_3$ is produced, and X is combined with inorganic substance to produce siloxane; n is a positive integral and ranged from 0 to 3; Y is an organic functional group, and chemically reacts with polymer to produce a hydrogen bond.

14. The organic light-emitting device according to claim 13, wherein, the X is a methoxy group, a chloro group, an ethoxy group, a acetoxy group, or a methoxy ethoxy; the Y is a vinyl group, an amino group, a methacryloyloxy group, a mercapto group or a urea group.

15. The organic light-emitting device according to claim 13, wherein, a chemical formula of the organic packaging layer is $S_iO_xC_yH_z$, a thickness of the organic packaging layer ranges from 1000 nm to 5000 nm.

16. The organic light-emitting device according to claim 15, wherein, the buffer sublayer is formed by depositing on the coupling agent unit through a plasma enhanced chemical vapor deposition (PECVD) method, a gas flow ratio of $O_2$ to Hexamethyldisiloxane (HMDSO) for depositing the buffer sublayer is that $O_2$:HMDSO<3:1, wherein, a radio frequency power of HMDSO ranges from 200 W to 800 W, a flow rate of HMDSO ranges from 10 sccm to 50 sccm, a radio frequency power of $O_2$ ranges from 200 W to 800 W, and a deposition time of the buffer sublayer ranges from 10 minutes to 50 minutes.

17. The organic light-emitting device according to claim 16, wherein, the resist sublayer is formed by depositing on the buffer sublayer through a plasma enhanced chemical vapor deposition (PECVD) method, a gas flow ratio of $O_2$ to Hexamethyldisiloxane (HMDSO) for depositing the resist sublayer is that 3:1<$O_2$:HMDSO<18:1, and wherein, a radio frequency power of HMDSO ranges from 200 W to 800 W, a flow rate of HMDSO ranges from 10 sccm to 50 sccm, a radio frequency power of $O_2$ ranges from 200 W to 800 W, a deposition time of the resist sublayer ranges is less than 2 minutes, and a deposition thickness of the resist sublayer ranges from 10 nm to 50 nm.

18. The organic light-emitting device according to claim 12, wherein, a composition of the first inorganic packaging layer is $SiO_2$, the first inorganic packaging layer is formed by deposition through a plasma enhanced chemical vapor deposition (PECVD) method, a gas flow ratio of $N_2O$ to $SiH_4$ for depositing the first inorganic packaging layer is that $N_2O$: $SiH_4$ >2:1, and wherein, a radio frequency power of $SiH_4$ ranges from 10 W to 100 W, a flow rate of $SiH_4$ ranges from 10 sccm to 50 sccm, a radio frequency power of $N_2O$ ranges from 10 W to 100 W, a deposition time of the first inorganic packaging layer ranges from 10 minutes to 20 minutes, and a deposition thickness of the first inorganic packaging layer ranges from 10 nm to 50 nm.

19. The organic light-emitting device according to claim 12, wherein, the OLED layer, the first inorganic packaging layer, the coupling agent unit, the buffer sublayer, and the resist sublayer are sequentially stacked on the TFT substrate.

20. The organic light-emitting device according to claim 12, wherein, the OLED layer, the first inorganic packaging layer, the buffer sublayer and the resist sublayer are sequentially stacked on the TFT substrate, and the coupling agent unit covers on outer edges of the first inorganic packaging layer and the buffer sublayer.

* * * * *